US011309371B2

(12) United States Patent
Liang et al.

(10) Patent No.: US 11,309,371 B2
(45) Date of Patent: Apr. 19, 2022

(54) DISPLAY SUBSTRATE, METHOD FOR MANUFACTURING THE SAME, AND DISPLAY DEVICE

(71) Applicants: CHONGQING BOE DISPLAY TECHNOLOGY CO., LTD., Chongqing (CN); BOE TECHNOLOGY GROUP CO., LTD., Beijing (CN)

(72) Inventors: Yongmin Liang, Beijing (CN); Yueyuan Jian, Beijing (CN)

(73) Assignees: CHONGQING BOE DISPLAY TECHNOLOGY CO., LTD., Chongqing (CN); BOE TECHNOLOGY GROUP CO., LTD., Beijing (CN)

( * ) Notice: Subject to any disclaimer, the term of this patent is extended or adjusted under 35 U.S.C. 154(b) by 84 days.

(21) Appl. No.: 15/931,151

(22) Filed: May 13, 2020

(65) Prior Publication Data

US 2021/0091149 A1 Mar. 25, 2021

(30) Foreign Application Priority Data

Sep. 19, 2019 (CN) .......................... 201910884563.4

(51) Int. Cl.
*H01L 27/32* (2006.01)
*H01L 51/56* (2006.01)
(Continued)

(52) U.S. Cl.
CPC ...... *H01L 27/3246* (2013.01); *H01L 27/3248* (2013.01); *H01L 27/3258* (2013.01);
(Continued)

(58) Field of Classification Search
CPC ............. H01L 27/3246; H01L 27/3258; H01L 51/525; H01L 51/5253
See application file for complete search history.

(56) References Cited

U.S. PATENT DOCUMENTS

| 2002/0093286 A1* | 7/2002 | Ohshita ............... H01L 51/0011 313/506 |
| 2005/0093438 A1* | 5/2005 | Chen .................. H01L 27/3248 313/506 |

(Continued)

FOREIGN PATENT DOCUMENTS

| CN | 109216407 A | * | 1/2019 | ......... H01L 27/3246 |
| CN | 109427846 A | * | 3/2019 | ......... H01L 27/3244 |

(Continued)

OTHER PUBLICATIONS

Machine translation, Ao, Chinese Pat. Pub. No. CN 109216407A, translation date: Sep. 28, 2021, Espacenet, all pages. (Year: 2021).*

(Continued)

*Primary Examiner* — Victoria K. Hall
(74) *Attorney, Agent, or Firm* — Brooks Kushman P.C.

(57) ABSTRACT

A display substrate, a method for manufacturing the same and a display device are provided. The method for manufacturing the display substrate includes: forming a control structure layer on a base substrate; forming a first planarization layer on the control structure layer; forming a support structure on the first planarization layer, a material of the support structure includes a negative photosensitive polymer; forming a protection layer enveloping the support structure on the first planarization layer formed with the support structure; forming a second planarization layer on the protection layer; and forming a first electrode on the second planarization layer, the first electrode is electrically connected to the control structure layer.

18 Claims, 7 Drawing Sheets

(51) Int. Cl.
  *H01L 51/00* (2006.01)
  *H01L 51/52* (2006.01)
(52) U.S. Cl.
  CPC ........ *H01L 51/0011* (2013.01); *H01L 51/525* (2013.01); *H01L 51/5253* (2013.01); *H01L 51/56* (2013.01); *H01L 27/3244* (2013.01); *H01L 27/3262* (2013.01); *H01L 51/001* (2013.01); *H01L 2227/323* (2013.01)

(56) References Cited

U.S. PATENT DOCUMENTS

| | | | | |
|---|---|---|---|---|
| 2007/0001596 | A1* | 1/2007 | Murayama | H01L 51/5253 313/506 |
| 2007/0085475 | A1* | 4/2007 | Kuwabara | H01L 27/3258 313/506 |
| 2008/0018229 | A1* | 1/2008 | Yamazaki | H01L 27/3262 313/498 |
| 2008/0197342 | A1* | 8/2008 | Lee | H01L 51/56 257/40 |
| 2009/0236981 | A1* | 9/2009 | Chang | H01L 27/32 313/504 |
| 2012/0228603 | A1* | 9/2012 | Nakamura | H01L 51/5234 257/40 |
| 2012/0273804 | A1* | 11/2012 | Hatano | H01L 51/525 257/79 |
| 2014/0035456 | A1* | 2/2014 | Isa | H01L 51/5253 313/498 |
| 2014/0346468 | A1* | 11/2014 | Kim | H01L 27/3246 257/40 |
| 2015/0014636 | A1* | 1/2015 | Kang | H01L 51/525 257/40 |
| 2015/0115234 | A1* | 4/2015 | Hong | H01L 51/5253 257/40 |
| 2015/0311473 | A1* | 10/2015 | Kim | H01L 27/3246 257/40 |
| 2016/0225833 | A1* | 8/2016 | Kim | H01L 27/3218 |
| 2017/0098688 | A1* | 4/2017 | Chang | H01L 51/525 |
| 2017/0155075 | A1* | 6/2017 | Bi | H01L 51/525 |
| 2017/0186827 | A1* | 6/2017 | You | H01L 27/3258 |
| 2017/0221982 | A1* | 8/2017 | Park | H01L 51/0096 |
| 2017/0256597 | A1* | 9/2017 | Lee | H01L 51/5253 |
| 2018/0033848 | A1* | 2/2018 | Jung | H01L 27/3262 |
| 2018/0033998 | A1* | 2/2018 | Kim | H01L 27/3246 |
| 2018/0097034 | A1* | 4/2018 | Lee | H01L 23/3142 |
| 2018/0097048 | A1* | 4/2018 | Kimura | H01L 51/56 |
| 2018/0151842 | A1* | 5/2018 | Park | H01L 51/5275 |
| 2018/0190731 | A1* | 7/2018 | Park | G09G 3/3225 |
| 2018/0203062 | A1* | 7/2018 | Lee | H01L 51/5228 |
| 2018/0226612 | A1* | 8/2018 | Choi | H01L 27/3246 |
| 2018/0286925 | A1* | 10/2018 | Kim | H01L 51/525 |
| 2018/0350889 | A1* | 12/2018 | Son | H01L 27/3248 |
| 2018/0358584 | A1* | 12/2018 | Jeong | H01L 51/5253 |
| 2018/0366682 | A1* | 12/2018 | Kang | H01L 27/3262 |
| 2019/0036073 | A1* | 1/2019 | Yu | H01L 27/124 |
| 2019/0067409 | A1* | 2/2019 | Shin | H01L 27/3258 |
| 2019/0095007 | A1* | 3/2019 | Jeong | H01L 27/323 |
| 2019/0131364 | A1* | 5/2019 | Hayk | H01L 51/5253 |
| 2019/0131365 | A1* | 5/2019 | Jung | H01L 27/1248 |
| 2019/0140037 | A1* | 5/2019 | Lee | H01L 27/3276 |
| 2019/0165060 | A1* | 5/2019 | Choi | H01L 51/0097 |
| 2019/0165312 | A1* | 5/2019 | Bae | G09G 3/20 |
| 2019/0173042 | A1* | 6/2019 | Lim | H01L 51/525 |
| 2019/0181198 | A1* | 6/2019 | Son | H01L 27/1288 |
| 2019/0181202 | A1* | 6/2019 | Lim | H01L 51/5278 |
| 2019/0198590 | A1* | 6/2019 | Kim | H01L 27/3258 |
| 2019/0198592 | A1* | 6/2019 | Zhang | H01L 21/3086 |
| 2019/0212780 | A1* | 7/2019 | Choi | G09G 3/3266 |
| 2019/0245161 | A1* | 8/2019 | Lee | H01L 27/3276 |
| 2019/0280065 | A1* | 9/2019 | Kim | H01L 27/3258 |
| 2019/0288231 | A1* | 9/2019 | He | H01L 27/3246 |
| 2019/0319075 | A1* | 10/2019 | Lee | G06F 3/0446 |
| 2019/0319076 | A1* | 10/2019 | Lee | G06F 3/0412 |
| 2019/0348482 | A1* | 11/2019 | Bae | H01L 27/3246 |
| 2019/0363275 | A1* | 11/2019 | Ochi | H05B 33/04 |
| 2019/0371865 | A1* | 12/2019 | Lee | H01L 27/3276 |
| 2020/0027933 | A1* | 1/2020 | Heo | H01L 51/5012 |
| 2020/0052050 | A1* | 2/2020 | Jiang | H01L 51/5253 |
| 2020/0106053 | A1* | 4/2020 | Xiao | H01L 51/0097 |
| 2020/0119114 | A1* | 4/2020 | Kim | H01L 51/0016 |
| 2020/0119302 | A1* | 4/2020 | Kim | H01L 27/3246 |
| 2020/0135836 | A1* | 4/2020 | Gao | H01L 27/3276 |
| 2020/0144532 | A1* | 5/2020 | Jin | H01L 51/56 |
| 2020/0152716 | A1* | 5/2020 | Zhao | H01L 51/5253 |
| 2020/0161392 | A1* | 5/2020 | Wang | H01L 51/56 |
| 2020/0168823 | A1* | 5/2020 | Kim | H01L 27/3246 |
| 2020/0194534 | A1* | 6/2020 | Park | H01L 27/3258 |
| 2020/0212354 | A1* | 7/2020 | Zhang | H01L 51/5253 |
| 2020/0274097 | A1* | 8/2020 | Ichikawa | H01L 51/525 |
| 2020/0287157 | A1* | 9/2020 | Seong | H01L 51/525 |
| 2020/0295310 | A1* | 9/2020 | Moon | H01L 27/3279 |
| 2020/0303664 | A1* | 9/2020 | Choi | H01L 27/3276 |
| 2020/0335717 | A1* | 10/2020 | Kim | H01L 51/56 |
| 2020/0350519 | A1* | 11/2020 | Sasaki | H01L 51/56 |
| 2021/0028388 | A1* | 1/2021 | Jiang | H01L 27/3246 |
| 2021/0066410 | A1* | 3/2021 | Jo | H01L 27/3246 |
| 2021/0074781 | A1* | 3/2021 | Luo | H01L 27/322 |
| 2021/0083226 | A1* | 3/2021 | Okabe | H01L 51/525 |
| 2021/0134904 | A1* | 5/2021 | Zhao | H01L 27/3246 |
| 2021/0234122 | A1* | 7/2021 | Choi | H01L 51/5253 |
| 2021/0273194 | A1* | 9/2021 | Xie | H01L 51/56 |

FOREIGN PATENT DOCUMENTS

| | | | | |
|---|---|---|---|---|
| CN | 109599426 A | * | 4/2019 | H01L 27/32 |
| CN | 110164916 A | * | 8/2019 | H01L 27/32 |
| KR | 10-2017-0002148 | * | 1/2017 | H01L 27/32 |

OTHER PUBLICATIONS

Machine translation, Li, Chinese Pat. Pub. No. CN 109599426A, translation date: Sep. 28, 2021, Espacenet, all pages. (Year: 2021).*

Machine translation, Park, Korean Pat. Pub. No. KR20170002148A, translation date: Sep. 28, 2021, Espacenet, all pages. (Year: 2021).*

Machine translation, Sun, Chinese Pat. Pub. No. CN 109427846A, translation date: Sep. 28, 2021, Espacenet, all pages. (Year: 2021).*

Machine translation, Zhang, Chinese Pat. Pub. No. CN 110164916A, translation date: Sep. 28, 2021, Espacenet, all pages. (Year: 2021).*

First Office Action, Chinese Pat. App. No. 201910884563.4, The State Intellectual Property Office of People's Republic of China, Jul. 20, 2021, all pages. (Year: 2021).*

First Search Report, Chinese Pat. App. No. 2019108845634, The State Intellectual Property Office of People's Republic of China, Jul. 12, 2021, all pages. (Year: 2021).*

* cited by examiner

DISPLAY SUBSTRATE, METHOD FOR MANUFACTURING THE SAME, AND DISPLAY DEVICE

CROSS-REFERENCE TO RELATED APPLICATION

This application claims priority to Chinese Patent Application No. 201910884563.4 filed on Sep. 19, 2019, which is incorporated herein by reference in its entirety.

TECHNICAL FIELD

The present disclosure relates to the field of display technology, and in particular to a display substrate, a method for manufacturing the display substrate and a display device.

BACKGROUND

During an organic light-emitting diode (OLED) evaporation process, in order to maintain a certain distance between a mask and a substrate, it is normally necessary to dispose a support structure on the substrate to be evaporated, to maintain the distance between the mask and the substrate.

There are two types of materials often used to form the support structure, namely, a positive glue (e.g., positive photoresist) and a negative glue (e.g., negative photoresist). The positive photoresist is a high polymer, and the negative photoresist is composed of small molecule components. Compared with the support structure made of the positive photoresist, the support structure made of the negative photoresist has a better mask support effect. However, since the negative photoresist is composed of small molecule components, a density of the negative photoresist is not as good as that of the positive photoresist, and hydroscopicity and air permeability of the negative photoresist are also very high. Therefore, when the negative photoresist is used to manufacture the support structure, although the support effect is improved, water vapor cannot be isolated effectively, which tends to corrode a light-emitting layer, thereby impacting a service life of a light-emitting device.

SUMMARY

The present disclosure provides, in some embodiments, a method for manufacturing a display substrate, including:
forming a control structure layer on a base substrate;
forming a first planarization layer on the control structure layer;
forming a support structure on the first planarization layer, where a material of the support structure includes a negative photosensitive polymer;
forming a protection layer enveloping the support structure on the first planarization layer formed with the support structure;
forming a second planarization layer on the protection layer; and
forming a first electrode on the second planarization layer, where the first electrode is electrically connected to the control structure layer.

Optionally, the forming the control structure layer on the base substrate includes:
forming an active layer and a gate electrode on the base substrate;
forming a third insulation layer on the base substrate formed with the active layer and the gate electrode, where a first via hole and a second via hole are formed in the third insulation layer; and
forming a source electrode and a drain electrode on the third insulation layer, where the source electrode and the drain electrode are electrically connected to the active layer through the first via hole and the second via hole respectively.

Optionally, the forming the second planarization layer on the protection layer includes:
forming an intermediate metal layer on the protection layer, where the intermediate metal layer is electrically connected to the control structure layer by penetrating the protection layer and the first planarization layer; and
forming the second planarization layer on the base substrate formed with the intermediate metal layer, where a fourth via hole revealing the intermediate metal layer is formed in the second planarization layer, and the first electrode is electrically connected to the intermediate metal layer through the fourth via hole.

Optionally, a material of the first planarization layer includes a positive polyimide.

Optionally, the method further includes:
forming a pixel definition layer on the first electrode, where the pixel definition layer is provided with a sub-pixel opening revealing the first electrode; and
forming a light-emitting layer in the sub-pixel opening.

Optionally, the protection layer is made of silicon nitride, silicon oxide, or a composite of silicon nitride/silicon oxide.

The present disclosure further provides, in some embodiments, a display substrate, including:
a base substrate,
a control structure layer disposed on the base substrate;
a first planarization layer disposed on the control structure layer;
a support structure disposed on the first planarization layer, where the support structure is made of a negative photosensitive polymer;
a protection layer disposed on the first planarization layer formed with the support structure, where the protection layer covers the support structure;
a second planarization layer disposed on the protection layer; and
a first electrode disposed on the second planarization layer, where the first electrode is electrically connected to the control structure layer.

Optionally, a cross-section of the support structure in a direction perpendicular to the base substrate is of an inverted trapezoid shape, and a width of a top edge of the support structure that is away from the base substrate is larger than a width of a bottom edge of the support structure that is toward the base substrate.

Optionally, an angle between a side surface of the support structure and a bottom surface of the support structure that is toward the base substrate ranges from 90° to 130°.

Optionally, a size of the support structure in a direction perpendicular to the base substrate ranges from 1.0 µm to 1.5 µm.

Optionally, a thickness of the protection layer ranges from 3000 angstroms to 5000 angstroms.

Optionally, a material of the first planarization layer includes a positive polyimide.

Optionally, the display substrate further includes an intermediate metal layer disposed between the protection layer and the second planarization layer, the intermediate metal layer is electrically connected to the control structure layer by penetrating the protection layer and the first planarization layer, and the first electrode is electrically connected to the intermediate metal layer by penetrating the second planarization layer.

Optionally, the display substrate further includes a pixel definition layer disposed on the first electrode, the pixel definition layer is provided with a sub-pixel opening revealing the first electrode, and a light-emitting layer is disposed in the sub-pixel opening.

Optionally, the display substrate further includes a plurality of pixel units, each of the plurality of pixel units includes a plurality of sub-pixels, and the support structure is disposed between two adjacent pixel units.

Optionally, the support structure is a strip-shaped structure and is disposed between two adjacent columns or rows of pixel units.

Optionally, the support structure includes a plurality of support pillars sequentially disposed in equal distance from one another, the support structure is disposed between two adjacent columns or rows of pixel units, and each of the plurality of support pillars is disposed between two adjacent pixel units.

The present disclosure further provides, in some embodiments, a display device, including the display substrate described above.

BRIEF DESCRIPTION OF THE DRAWINGS

The drawings are used to provide a further understanding of the technical solutions of the present disclosure, and constitute a part of the specification. And the drawings are used to illustrate, together with the embodiments of the present application, the technical solutions of the present disclosure, and do not constitute a limitation on the technical solutions of the present disclosure.

DETAILED DESCRIPTION

In order to make objectives, technical solutions and advantages of the present disclosure more comprehensible, the embodiments of the present disclosure are described in further detail below with reference to the accompanying drawings. It should be noted that, on the condition that there is no conflict, the embodiments in the present disclosure and the features in the embodiments may be arbitrarily combined with each other.

FIG. 1a to FIG. 1d are schematic diagrams illustrating a process for manufacturing a display substrate in some embodiments of the present disclosure. Referring to FIG. 1a to FIG. 1d, the process for manufacturing the display substrate is as follows.

Figure 1A:
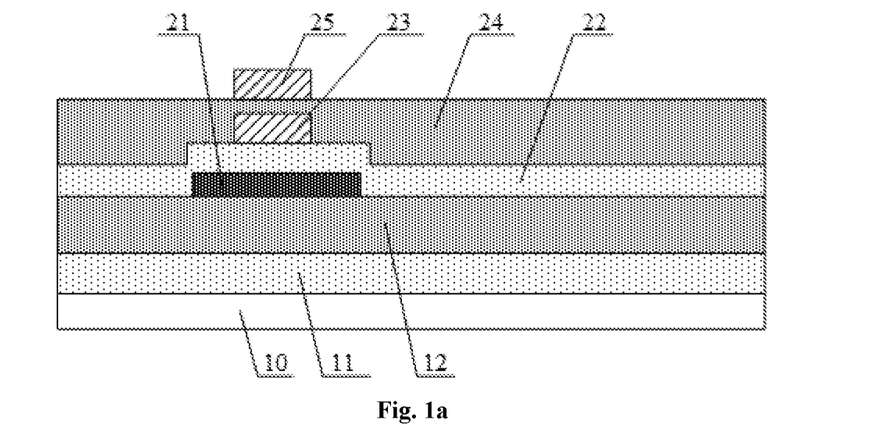
FIG. 1a to FIG. 1d are schematic diagrams illustrating a process for manufacturing a display substrate in some embodiments of the present disclosure.

As shown in FIG. 1a, a flexible base substrate 11 is formed on a glass base substrate 10; a buffer layer 12 is formed on the flexible base substrate 11; an active layer 21 is formed on the buffer layer 12; a first insulation layer 22 is formed on the active layer 21; a first gate electrode 23 is formed on the first insulation layer 22; a second insulation layer 24 is formed on the first gate electrode 23; and a second gate electrode 25 is formed on the second insulation layer 24. The flexible base substrate 11 may be made of polyimide (PI); the buffer layer 12, the first insulation layer 22 and the second insulation layer 24 may be made of silicon nitride (SiNx), silicon oxide (SiOx), or a composite of SiNx/SiOx; the gate electrode may be made of one or more kinds of metals, such as Pt, Ru, Au, Ag, Mo, Cr, Al, Ta, Ti, W; the active layer 21 may be made of polysilicon (p-Si).

Figure 1B:
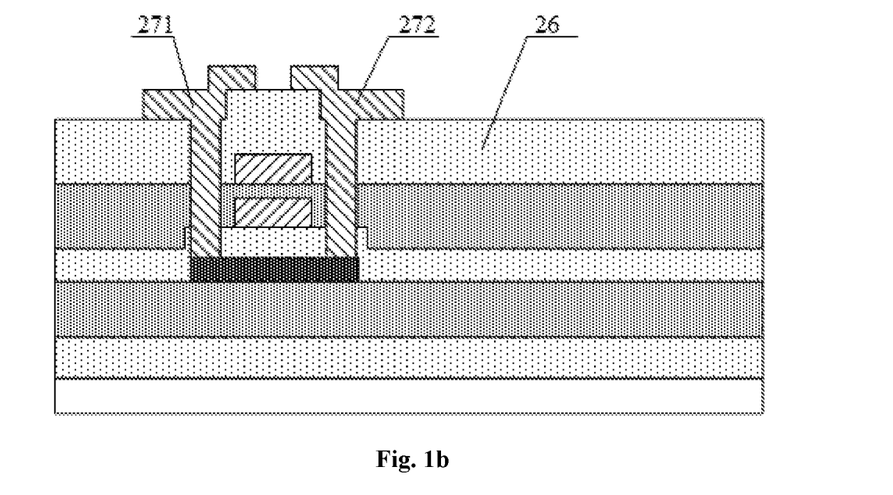

As shown in FIG. 1b, a third insulation layer 26 is formed on the glass base substrate 10 on which the second gate electrode 25 is formed. The third insulation layer 26 is provided with a first via hole and a second via hole revealing the active layer 21. A source electrode 271 and a drain electrode 272 are formed on the third insulation layer 26, and the source electrode 271 and the drain electrode 272 are electrically connected to the active layer 21 through the first via hole and the second via hole respectively. The third insulation layer 26 may be made of silicon nitride (SiNx), silicon oxide (SiOx), or a composite of SiNx/SiOx.

Figure 1C:
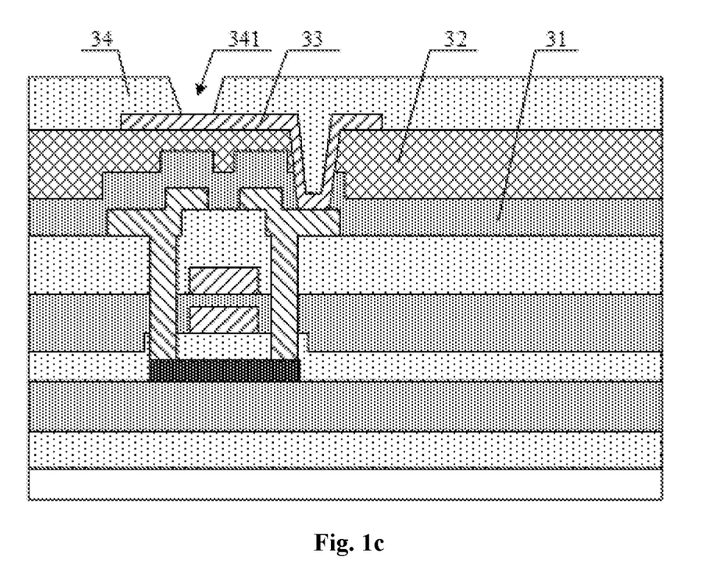

As shown in FIG. 1c, a passivation layer 31 and a first planarization layer 32 are sequentially formed on the glass base substrate 10 on which the source electrode 271 and the drain electrode 272 are formed. The passivation layer 31 and the first planarization layer 32 are provided with a third via hole revealing the drain electrode 272. An intermediate metal layer 33 is formed on the first planarization layer 32, and the intermediate metal layer 33 is electrically connected to the drain electrode 272 through the third via hole. A second planarization layer 34 is formed on the intermediate metal layer 33, and the second planarization layer 34 is provided with a fourth via hole 341 revealing the intermediate metal layer 33.

Figure 1D:
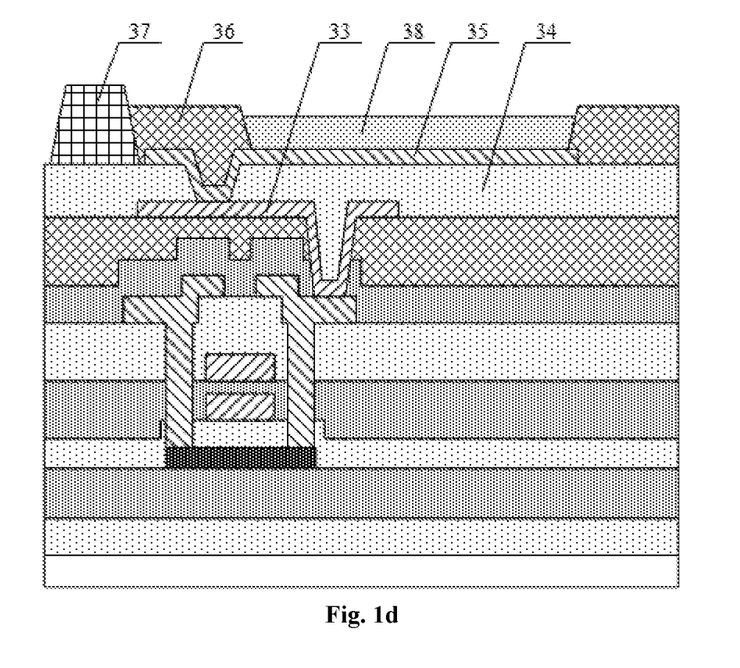

As shown in FIG. 1d, a first electrode 35 is formed on the second planarization layer 34, and the first electrode 35 is electrically connected to the intermediate metal layer 33 through the fourth via hole. The first electrode 35 is usually an anode of an OLED device, and the first electrode 35 is located in a sub-pixel region. A pixel definition layer 36 is formed on the second planarization layer 34 on which the first electrode 35 is formed, and the pixel definition layer 36 is provided with a sub-pixel opening revealing the first electrode 35 and a support opening revealing the second planarization layer 34. A photoresist film is coated on the pixel definition layer 36. After the photoresist film is exposed and developed, a support structure 37 is formed at the support opening. A bottom surface of the support structure 37 is in contact with the second planarization layer 34. A top surface of the support structure 37 is higher than a top surface of the pixel definition layer 36; a light-emitting layer 38 is formed at the sub-pixel opening by using an evaporation process. It should be appreciated that only one sub-pixel is shown in FIG. 1a to FIG. 1d. It is easily understood that, a pixel unit may include three sub-pixels, such as a red (R) sub-pixel, a green (G) sub-pixel and a blue (B) sub-pixel, and each sub-pixel has a corresponding thin film transistor.

In FIG. 1d, the photoresist used to form the support structure 37 is a positive photoresist. The positive photoresist is a high polymer. During an exposure process, an irradiated part of the positive photoresist may break down into small molecules and may be removed by using a development process, and a masked part of the positive photoresist remains due to a lack of light irradiation. During the exposure process of the positive photoresist, diffracted lights are generated at sides of the masked part, which are incident to and absorbed by the positive photoresist, so that the corresponding positive photoresist is exposed. Thus a remaining part has an acute angle of slope, such that a shape of the formed support structure is similar to a trapezoid. Therefore, as shown in FIG. 1d, a cross-sectional shape of the support structure 37 is a trapezoid. When the light-emitting layer 38 is formed by using the evaporation process, the support structure 37 may act to support a mask, so as to ensure a distance between the mask and a substrate to be evaporated, thereby improving an evaporation effect.

Figure 2:
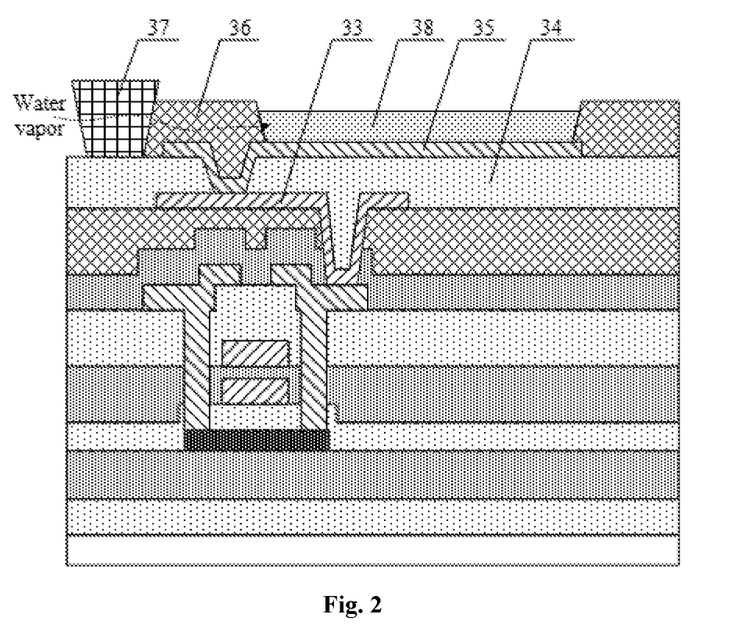
FIG. 2 is a schematic structural diagram of a display substrate in some embodiments of the present disclosure.

FIG. 2 is a schematic structural diagram of a display substrate in some embodiments of the present disclosure. In FIG. 1d, the support structure 37 is of a trapezoid shape, a contact face (i.e., a top surface of the support structure 37) between the support structure 37 and the mask is small, and a support effect is poor. In order to improve the support effect of the support structure 37 on the mask, the photoresist for forming the support structure is a negative photoresist in some embodiments of the present disclosure, as shown in FIG. 2, which is different from that in FIG. 1a to FIG. 1d. A property of the negative photoresist is opposite to that of the positive photoresist, and the negative photoresist is composed of small molecule components. After an exposure process, a masked part of the negative photoresist is removed by a development process due to a lack of light irradiation, and an irradiated part of the negative photoresist remains by absorbing energy of the light and becoming a high polymer. During the exposure process of the negative photoresist, diffracted lights are generated at sides of the masked part, which are incident to and absorbed by the negative photoresist, so that the corresponding negative photoresist becomes the high polymer. Thus the remaining part forms an obtuse angle of slope, such that a shape of the formed support structure is similar to an inverted trapezoid. Therefore, as shown in FIG. 2, the cross-sectional shape of the formed support structure 37 is an inverted trapezoid. As far as the support effect is concerned, the inverted trapezoid shape makes a contact area between the support structure and the mask larger, and thus yields better support effect. However, since the negative photoresist is composed of small molecule components, the density of the negative photoresist is not as good as that of the positive photoresist, and the hydroscopicity and air permeability of the negative photoresist are also very high. Therefore, when the negative photoresist is used to form the support structure, although the support effect is improved, the water vapor cannot be effectively isolated, which causes the light-emitting layer to be easily corroded, thereby impacting the service life of the light-emitting device.

Figure 3:
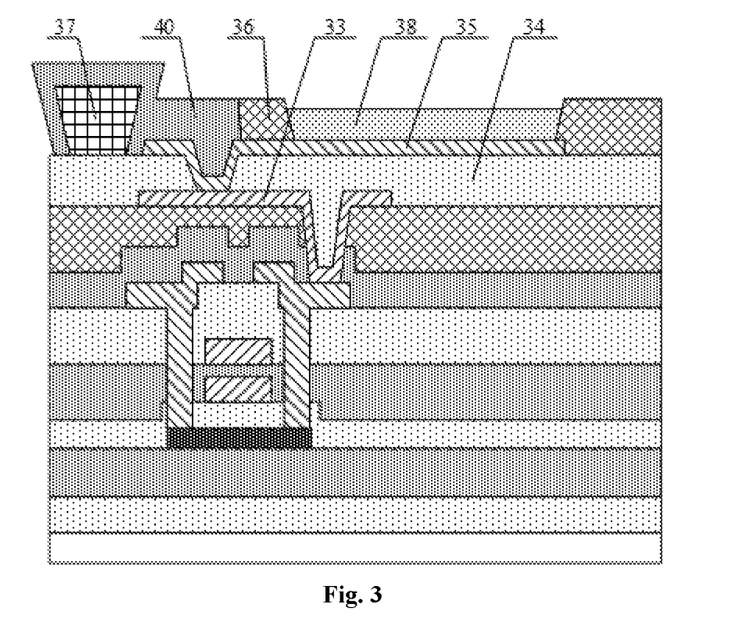
FIG. 3 is a schematic structural diagram of a display substrate in some embodiments of the present disclosure.

FIG. 3 is a schematic structural diagram of a display substrate in some embodiments of the present disclosure. In order to isolate the water vapor effectively, a display substrate structure is provided in some embodiments of the present disclosure, as shown in FIG. 3. Compared with the display substrate as shown in FIG. 2, the display substrate as shown in FIG. 3 further includes a protection layer 40 enveloping the support structure 37. In order to ensure an evaporation effect, an upper surface of a region of the protection layer 40 that is outside the support structure 37 may not be higher than an upper surface of the pixel definition layer 36. Therefore, the protection layer 40 is formed on the first electrode 35. Thus, a general process of forming the protection layer 40 is: forming the support structure 37 and the first electrode 35 on the second planarization layer 34; then forming a protection film covering the support structure 37 and the first electrode 35, where, in order to keep the water vapor out, a material of the protection film may include silicon nitride (SiNx) or/and silicon oxide (SiOx); and forming a pattern of the protection layer 40 by using a dry etching process after exposing and developing. However, during the process of forming the protection layer 40 by using the dry etching process, the first electrode 35 may be damaged by the dry etching process, thereby impacting the display performance of the display substrate. Therefore, the basic display structure as shown in FIG. 3 has some display defects.

In order to solve the above technical problems, a method for manufacturing a display substrate is provided in some embodiments of the present disclosure. The method for manufacturing the display substrate includes: forming a control structure layer on a base substrate; forming a first planarization layer on the control structure layer; forming a support structure on the first planarization layer, a material of the support structure includes a negative photosensitive polymer; forming a protection layer enveloping the support structure on the first planarization layer formed with the support structure; forming a second planarization layer on the protection layer; and forming a first electrode on the second planarization layer, the first electrode is electrically connected to the control structure layer.

According to the method for manufacturing the display substrate in some embodiments of the present disclosure, the protection layer enveloping the support structure is formed on the support structure. The protection layer may prevent the intrusion of water vapor through the support structure, which effectively isolates the water vapor, and avoids the problem of corrosion of subsequently formed light-emitting layer. In addition, compared with the display substrate as shown in FIG. 3, in the method for manufacturing the display substrate according to the embodiments of the present disclosure, a process of forming the first electrode is after a process of forming the protection layer, so that the process of forming the protection layer may be prevented from affecting the first electrode, which ensures the display performance of the display substrate. Furthermore, the support structure is formed on the first planarization layer, which ensures that a plurality of support structures are formed on a same planarization surface, thereby ensuring the flatness of top surfaces of the plurality of support structures, ensuring a gap between the mask and the substrate in the evaporation process, and improving the evaporation effect.

The technical content of the present disclosure will be described below in detail with reference to specific embodiments.

A method for manufacturing a display substrate is provided in some embodiments of the present disclosure, referring to FIG. 4 to FIG. 9, the method for manufacturing the display substrate includes the following steps.

Step S1, forming a control structure layer 20 on a base substrate 1.

Step S2, forming a first planarization layer 32 on the control structure layer 20.

Step S3, forming a support structure 37 on the first planarization layer 32, where a material of the support structure 37 includes a negative photosensitive polymer.

Step S4, forming a protection layer 40 enveloping the support structure 37 on the first planarization layer 32 formed with the support structure 37.

Step S5, forming a second planarization layer 34 on the protection layer 40.

Step S6, forming a first electrode 35 on the second planarization layer 34, where the first electrode 35 is electrically connected to the control structure layer 20.

According to the method for manufacturing the display substrate in some embodiments of the present disclosure, the protection layer 40 enveloping the support structure 37 is formed on the support structure 37. The protection layer 40 may prevent the intrusion of water vapor through the support structure 37, which effectively isolates the water vapor, and avoids the problem of corrosion of subsequently formed light-emitting layer. In addition, compared with the display substrate as shown in FIG. 3, in the method for manufacturing the display substrate according to the embodiments of the present disclosure, a process of forming the first electrode 35 is after a process of forming the protection layer 40, so that the process of forming the protection layer 40 may be prevented from affecting the first electrode 35, which ensures the display performance of the display substrate. Furthermore, the support structure 37 is formed on the first planarization layer 32, which ensures that a plurality of support structures 37 are formed on a same planarization surface, thereby ensuring the flatness of top surfaces of the plurality of support structures 37, ensuring a gap between the mask and the substrate in the evaporation process, and improving the evaporation effect.

In some embodiments, the control structure layer 20 includes a thin film transistor formed on the base substrate. Thus, the forming the control structure layer on the base substrate may include: forming an active layer and a gate electrode on the base substrate; forming a third insulation layer on the base substrate formed with the active layer and the gate electrode, where a first via hole and a second via hole are formed in the third insulation layer; and forming a source electrode and a drain electrode on the third insulation layer, where the source electrode and the drain electrode are electrically connected to the active layer through the first via hole and the second via hole respectively.

Then the first planarization layer 32 is formed on the source electrode and the drain electrode. The protection layer 40 may be made of silicon nitride (SiNx), silicon oxide (SiOx), or a composite of SiNx/SiOx. In this way, compared with the method for manufacturing the display substrate as shown in FIG. 1a to FIG. 1e, the process of forming the passivation layer 31 and the process of forming the first planarization layer 32 are exchanged in order, and the support structure 37 is formed between the first planarization layer 32 and the passivation layer 31 with the passivation layer functioning as the protection layer 40. Thus, not only the protection layer 40 enveloping the support structure 37 is formed, but also the number of the masking processes of the display substrate is not increased, thereby reducing costs and increasing productivity.

It should be appreciated that, without considering the number of the masking processes and the process costs, it is possible to form the passivation layer on the source electrode and the drain electrode, form the first planarization layer on the passivation layer, form the support structure on the first planarization layer, and then form the protection layer enveloping the support structure.

In some embodiments, the forming the second planarization layer on the protection layer may include: forming an intermediate metal layer on the protection layer, where the intermediate metal layer is electrically connected to the control structure layer by penetrating the protection layer and the first planarization layer; and forming the second planarization layer on the base substrate formed with the intermediate metal layer, where a fourth via hole revealing the intermediate metal layer is formed in the second planarization layer, and the first electrode is electrically connected to the intermediate metal layer through the fourth via hole.

In some embodiments, the method for manufacturing the display substrate may further include: forming a pixel definition layer on the first electrode, where the pixel definition layer is provided with a sub-pixel opening revealing the first electrode; and forming a light-emitting layer in the sub-pixel opening.

In some embodiments, the light-emitting layer is formed in the sub-pixel opening by using an evaporation process.

Hereinafter, the technical solutions of some embodiments of the present disclosure will be described in detail with reference to a process of manufacturing a display substrate. "Patterning process" mentioned in the embodiment includes processes such as depositing a film, coating a photoresist, exposing by using a mask, developing, etching, and removing the photoresist, and is a well-known manufacturing process in the related art. The depositing may adopt known processes such as sputtering, evaporation, chemical vapor deposition; the coating may use known coating processes; and the etching may use known methods, which are not specifically limited herein. "Thickness" refers to a size of a film layer in a direction perpendicular to the base substrate.

Step S1, forming the control structure layer 20 on the base substrate. In some embodiments, the control structure layer 20 includes the thin film transistor formed on the base substrate. The thin film transistor includes the active layer, the gate electrode, the source electrode and the drain electrode. It should be appreciated that the thin film transistor may be a top gate thin film transistor, a bottom gate thin film transistor or a double-gate thin film transistor. In this embodiment, the double-gate thin film transistor is taken as an example to describe the specific steps of forming the control structure layer 20. The forming the control structure layer 20 on the base substrate includes the following sub-steps.

Sub-step S11, referring to FIG. 1a, forming the flexible base substrate 11 on the glass base substrate 10, a material of the flexible base substrate 11 may include polyimide (PI). A base substrate includes the glass base substrate 10 and the flexible base substrate 11 formed on the glass base substrate 10. The flexible base substrate 11 may be made of polyimide (PI).

Sub-step S12, referring to FIG. 1a, forming the buffer layer 12 on the flexible base substrate 11; forming the active layer 21 on the buffer layer 12 by using a patterning process; forming the first insulation layer 22 on the active layer 21; forming the first gate electrode 23 on the first insulation layer 22 by using a patterning process; forming the second insulation layer 24 on the first gate electrode 23; and forming the second gate electrode 25 on the second insulation layer 24 by using a patterning process.

The buffer layer 12, the first insulation layer 22 and the second insulation layer 24 may be made of silicon nitride (SiNx), silicon oxide (SiOx), or a composite of SiNx/SiOx; the gate electrode may be made of one or more kinds of metals, such as Pt, Ru, Au, Ag, Mo, Cr, Al, Ta, Ti, W; the active layer 21 may be made of polysilicon (p-Si).

Sub-step S13, referring to FIG. 1b, forming the third insulation layer 26 on the glass base substrate 10 on which the second gate electrode 25 is formed; coating a layer of photoresist on the third insulation layer 26, exposing, by using a mask, and developing the photoresist, to remove the photoresist at the first and second via holes to reveal the third insulation layer, and keep the photoresist elsewhere; etching the third insulation layer 26, the second insulation layer 24, and the first insulation layer 22 to form the first via hole and the second via hole revealing the active layer 21; forming the source electrode 271 and the drain electrode 272 on the third insulation layer 26 by using a patterning process. The source electrode 271 and the drain electrode 272 are electrically connected to the active layer 21 through the first via hole and the second via hole respectively.

The third insulation layer 26 may be made of silicon nitride (SiNx), silicon oxide (SiOx), or a composite of SiNx/SiOx. The source/drain electrode may be made of one or more kinds of metals, such as Pt, Ru, Au, Ag, Mo, Cr, Al, Ta, Ti, W.

Figure 4:
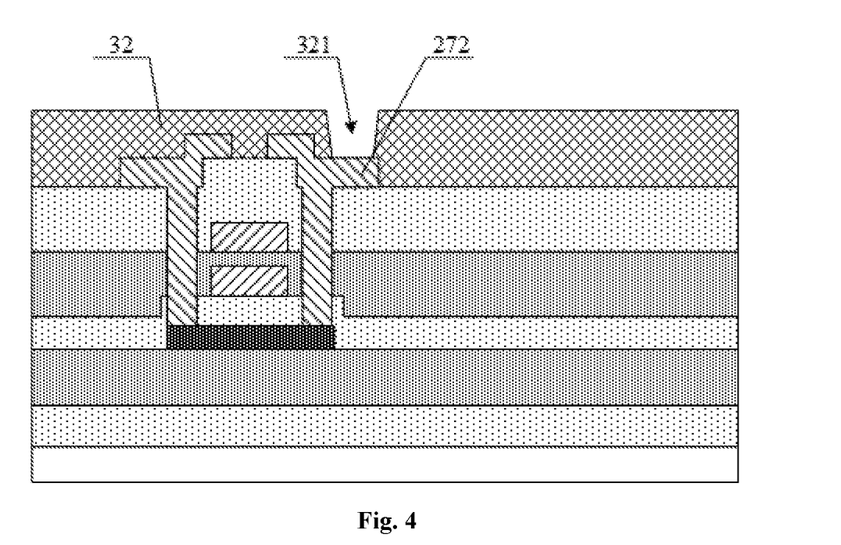
FIG. 4 is a schematic structural diagram of a display substrate after a first planarization layer is formed in some embodiments of the present disclosure.

Step S2, forming the first planarization layer 32 on the control structure layer 20, where the first planarization layer 32 is provided with a sub-via hole 321 revealing the drain electrode 272. The step specifically includes: coating a polymer film on the base substrate on which the source electrode and the drain electrode are formed; exposing, by using a mask, and developing the polymer film to form the first planarization layer 32, where the first planarization layer 32 is provided with the sub-via hole 321 revealing the drain electrode 272, as shown in FIG. 4. FIG. 4 is a schematic structural diagram of a display substrate after the first planarization layer is formed in some embodiments of the present disclosure.

Figure 5:
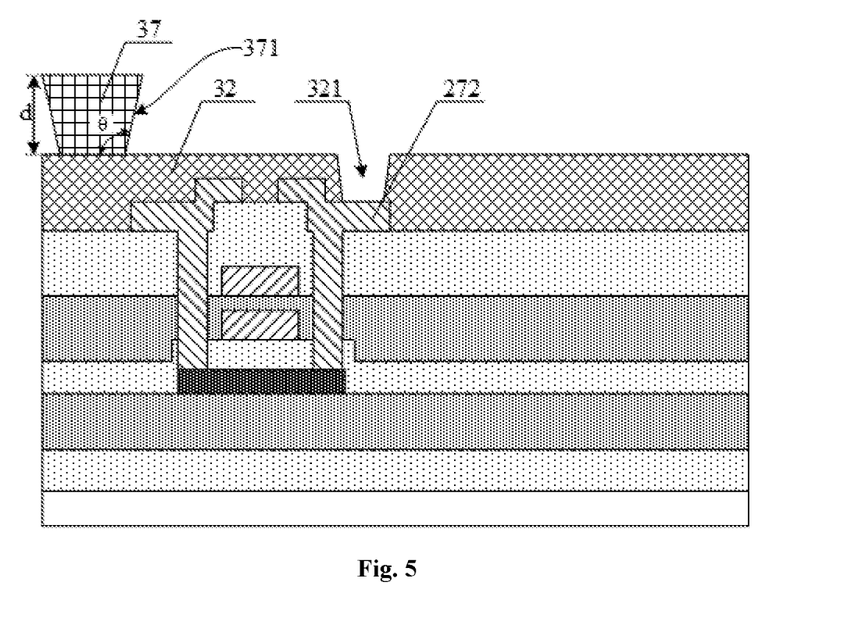
FIG. 5 is a schematic structural diagram of a display substrate after a support structure is formed in some embodiments of the present disclosure.

Step S3, forming the support structure 37 on the first planarization layer 32, where a material of the support structure 37 includes a negative photosensitive polymer. The step specifically includes: coating a negative photosensitive polymer film on the first planarization layer 32, exposing, by using a mask, and developing the negative photosensitive polymer film to form the support structure 37, as shown in FIG. 5. FIG. 5 is a schematic structural diagram of a display substrate after the support structure is formed in some embodiments of the present disclosure.

A slope angle of a side edge 371 of the support structure 37 is an obtuse angle, that is, an angle between the side edge 371 of the support structure 37 and a bottom edge of the support structure 37 is an obtuse angle. In some embodiments, the angle $\theta$ between the side edge 371 of the support structure 37 and the bottom edge of the support structure 37 ranges from 90° to 130°, and a height d of the support structure 37 (that is, a size of the support structure in a direction perpendicular to the base substrate) ranges from 1.0 μm to 1.5 μm.

Both the support structure 37 and the first planarization layer 32 are formed by using an exposure and development process. In order to avoid affecting the first planarization layer 32 during the process of forming the support structure 37, in some embodiments, the material of the first planarization layer 32 includes the positive photosensitive polymer, such as the positive polyimide, so that when the support structure is formed by using the exposure and development process, the first planarization layer 32 is not affected, and the performance and surface flatness of the first planarization layer 32 are guaranteed. In a specific implementation, the value of $\theta$ that meets the requirements may be obtained by controlling an intensity and duration of the exposure.

Figure 6:
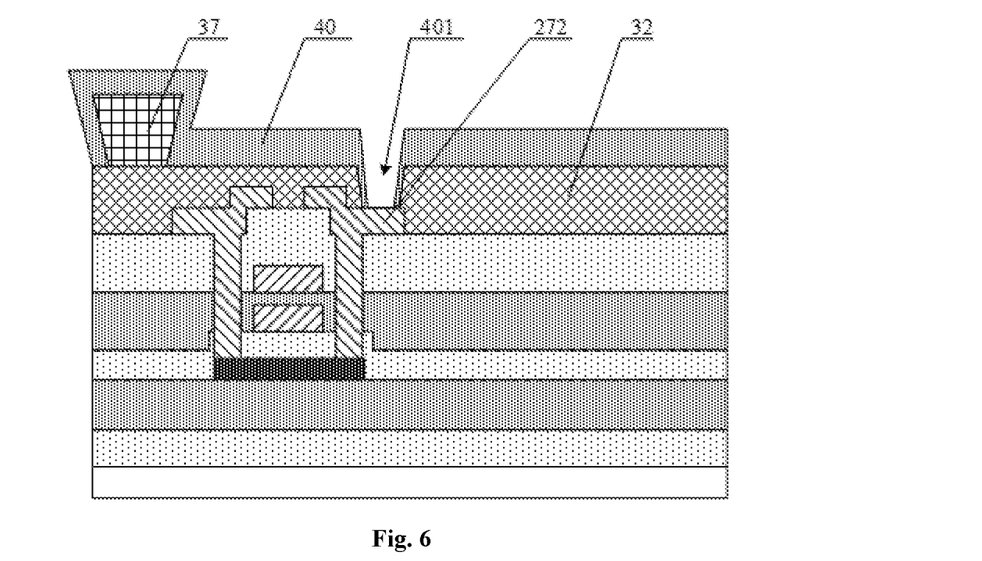
FIG. 6 is a schematic structural diagram of a display substrate after a protection layer is formed in some embodiments of the present disclosure.

Step S4, forming the protection layer 40 enveloping the support structure 37 on the first planarization layer 32 formed with the support structure 37. The step specifically includes: forming, by using a deposition process, a protection film on the base substrate on which the support structure 37 is formed, where the protection film envelops the support structure 37; coating a layer of photoresist on the protection film, exposing and developing the photoresist, to remove the photoresist at the sub-via hole 321, and keep the photoresist elsewhere; etching the protection film to form a third via hole 401 revealing the drain electrode 272 at the sub-via hole 321, thereby forming the protection layer 40 enveloping the support structure 37, as shown in FIG. 6. FIG. 6 is a schematic structural diagram of a display substrate after the protection layer is formed in some embodiments of the present disclosure.

The protection layer 40 may be made of silicon nitride (SiNx), silicon oxide (SiOx), or a composite of SiNx/SiOx.

The protection layer 40 envelops the support structure 37, and thus the protection layer 40 may prevent the intrusion of water vapor through the support structure 37, which effectively isolates the water vapor, avoids the problem of corrosion of the subsequently formed light-emitting layer, and improves the display performance of the display substrate. The material of the protection layer 40 is the same as that of the passivation layer. Therefore, the protection layer may also function as the passivation layer, and it is no longer necessary to form the passivation layer separately. Compared with the method for manufacturing the display substrate as shown in FIG. 1a to FIG. 1d, not only the protection layer 40 enveloping the support structure 37 is formed, but also the protection layer 40 serves as the passivation layer in the method for manufacturing the display substrate according to the embodiment of the present disclosure, which does not increase the number of the masking processes of the display substrate, reduces the costs and increases the productivity.

In some embodiments, a thickness of the protection layer 40 ranges from 3000 angstroms to 5000 angstroms.

With such a thickness, not only it is ensured that the protection layer 40 completely envelops the support structure 37, but also an excessive height of the finally formed display substrate at the position of the support structure 37 may be avoided.

Step S5, forming the second planarization layer 34 on the protection layer 40. The step includes the following sub-steps specifically.

Sub-step S51, forming the intermediate metal layer 33 on the protection layer 40 by using a patterning process, where the intermediate metal layer 33 is electrically connected to the drain electrode 272 through the third via hole 401.

The intermediate metal layer 33 may be made of one or more kinds of metals, such as Pt, Ru, Au, Ag, Mo, Cr, Al, Ta, Ti, W.

Figure 7:
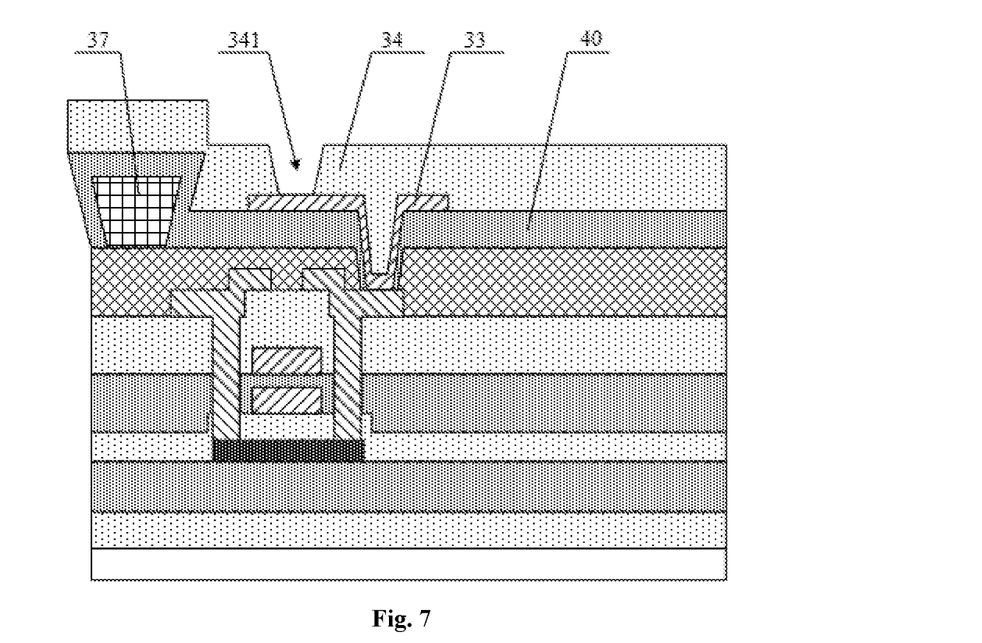
FIG. 7 is a schematic structural diagram of a display substrate after a second planarization layer is formed in some embodiments of the present disclosure.

Sub-step S52, coating a polymer film on the base substrate on which the intermediate metal layer 33 is formed; exposing, by using a mask, and developing the polymer film to form the second planarization layer 34, where the second planarization layer 34 is provided with the fourth via hole 341 revealing the intermediate metal layer 33, as shown in FIG. 7. FIG. 7 is a schematic structural diagram of a display substrate after the second planarization layer is formed in some embodiments of the present disclosure.

Since the support structure 37 has a large height, an upper surface of the second planarization layer 34 at the position of the support structure 37 is higher than an upper surface of the second planarization layer 34 elsewhere, therefore the second planarization layer 34 at the position of the support structure 37 may support the mask in a subsequent evaporation process. In some embodiments, the material of the second planarization layer 34 includes the positive photosensitive polymer, such as positive polyimide.

Figure 8:
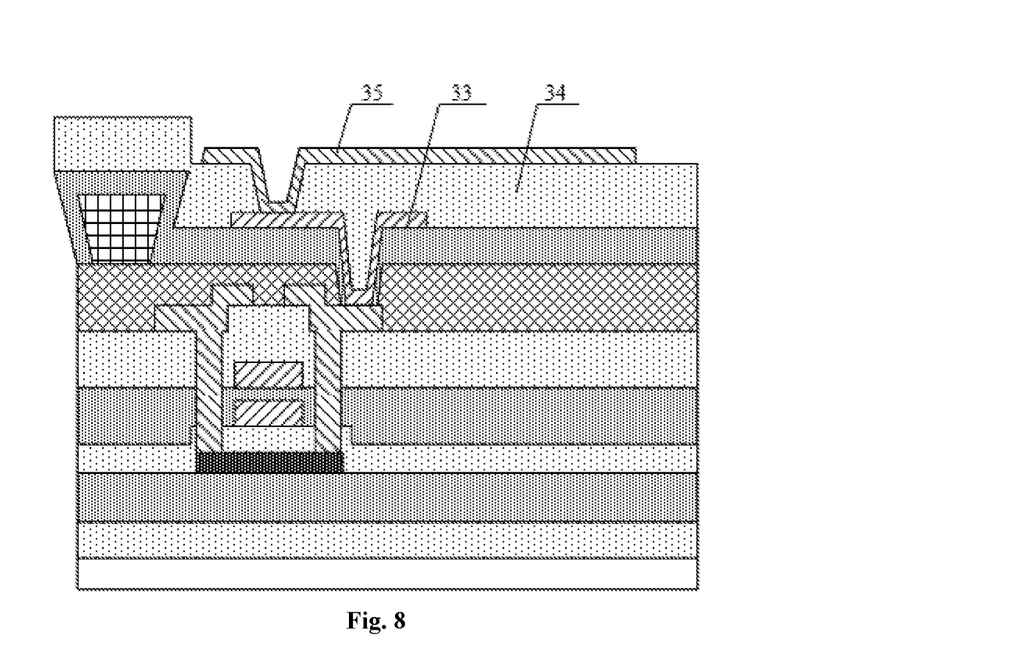
FIG. 8 is a schematic structural diagram of a display substrate after a first electrode is formed in some embodiments of the present disclosure.

Step S6, forming the first electrode 35 on the second planarization layer 34, where the first electrode 35 is electrically connected to the control structure layer 20. The step includes specifically: forming the first electrode 35 on the second planarization layer 34 by using a patterning process, where the first electrode 35 is usually an anode, and is electrically connected to the intermediate metal layer 33 through the fourth via hole 341, as shown in FIG. 8. FIG. 8 is a schematic structural diagram of a display substrate after the first electrode is formed in some embodiments of the present disclosure.

The intermediate metal layer 33 is electrically connected to the drain electrode through the third via hole 401, thus it is realized that the first electrode 35 is electrically connected to the control structure layer 20. The first electrode 35 is electrically connected to the drain electrode via the intermediate metal layer 33, thus a situation that the first electrode 35 is electrically connected to the drain electrode by penetrating the second planarization layer 34, the protection layer 40 and the first planarization layer 32 directly may be avoided, thereby reducing a connecting resistance of an electric connection between the first electrode 35 and the drain electrode, and improving the performance of the display substrate.

In some embodiments, the display substrate is an OLED display substrate, and the method for manufacturing the display substrate may further include the following steps.

Step S7, forming the pixel definition layer 36 on the second planarization layer 34 on which the first electrode 35 is formed, where the pixel definition layer 36 is provided with the sub-pixel opening revealing the first electrode 35.

Since the support structure 37 has a large height, an upper surface of the pixel definition layer 36 at the position of the support structure 37 is higher than an upper surface of the pixel definition layer 36 elsewhere, thus the pixel definition layer 36 at the position of the support structure 37 may support the mask in a subsequent evaporation process. In some embodiments, the material of the pixel definition layer 36 includes the positive photosensitive polymer, such as positive polyimide.

Figure 9:
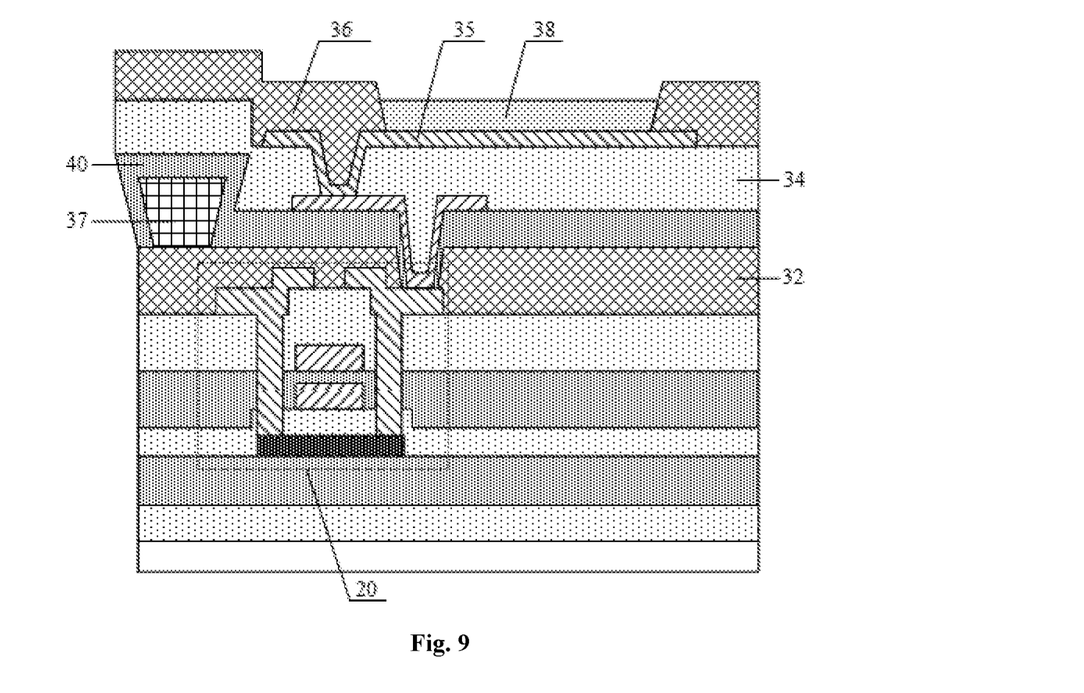
FIG. 9 is a schematic structural diagram of a display substrate after a light-emitting layer is formed in some embodiments of the present disclosure.

Step S8, forming the light-emitting layer 38 in the sub-pixel opening by using an evaporation process, as shown in FIG. 9. FIG. 9 is a schematic structural diagram of a display substrate after the light-emitting layer is formed in some embodiments of the present disclosure. The pixel definition layer 36 at the position of the support structure 37 may be used to support the mask in the evaporation process, so as to ensure a distance between the mask and the substrate, thereby improving the evaporation quality of light-emitting layer.

Based on the inventive concept of the above embodiments, a display substrate is further provided in some embodiments of the present disclosure. As shown in FIG. 9, the display substrate includes: a base substrate, a control structure layer 20 disposed on the base substrate, a first planarization layer 32 disposed on the control structure layer 20, and a support structure 37 disposed on the first planarization layer 32. A material of the support structure 37 includes a negative photosensitive polymer. The display substrate further includes a protection layer 40 disposed on the first planarization layer 32 on which the support structure 37 is formed, the protection layer 40 envelops the support structure 37. A second planarization layer 34 is disposed on the protection layer 40, a first electrode 35 is disposed on the second planarization layer 34, and the first electrode 35 is electrically connected to the control structure layer 20.

In some embodiments, a cross-section of the support structure 37 in a direction perpendicular to the base substrate is of an inverted trapezoid shape, and a width of a top edge of the support structure 37 that is away from the base substrate is larger than a width of a bottom edge of the support structure that is toward the base substrate.

In some embodiments, an angle between a side surface of the support structure and a bottom surface of the support structure that is toward the base substrate ranges from 90° to 130°.

In some embodiments, a size of the support structure 37 in the direction perpendicular to the base substrate ranges from 1.0 μm to 1.5 μm.

In some embodiments, a thickness of the protection layer ranges from 3000 angstroms to 5000 angstroms.

In some embodiments, a material of the first planarization layer includes a positive polyimide.

In some embodiments, the display substrate further includes an intermediate metal layer 33 disposed between the protection layer 40 and the second planarization layer 34, the intermediate metal layer 33 is electrically connected to the control structure layer 20 by penetrating the protection layer 40 and the first planarization layer 32; and the first electrode 35 is electrically connected to the intermediate metal layer 33 by penetrating the second planarization layer 34. Since the insulation layer between the first electrode and the control structure layer 20 is thick, by providing the intermediate metal layer 33, a connecting resistance of a connection between the first electrode 35 and the control structure layer 20 may be reduced, thereby improving the performance of the display substrate.

In some embodiments, the display substrate further includes a pixel definition layer 36 disposed on the first electrode 35, the pixel definition layer 36 is provided with a sub-pixel opening revealing the first electrode 35, and a light-emitting layer 38 is disposed in the sub-pixel opening.

The display substrate may be an OLED display substrate. The OLED display substrate includes a plurality of pixel units, and each of the plurality of pixel units includes an R sub-pixel, a G sub-pixel, and a B sub-pixel. The support structure 37 may be disposed between two adjacent pixel units.

In some embodiments, in a top view of the display substrate, the support structure is a strip-shaped structure and is disposed between two adjacent columns or rows of pixel units.

In some embodiments, in a top view of the display substrate, the support structure includes a plurality of support pillars sequentially disposed in equal distance from one another, and the support structure is disposed between two adjacent columns or rows of pixel units. Each of the plurality of support pillars is disposed between two adjacent pixel units.

Figure 10:
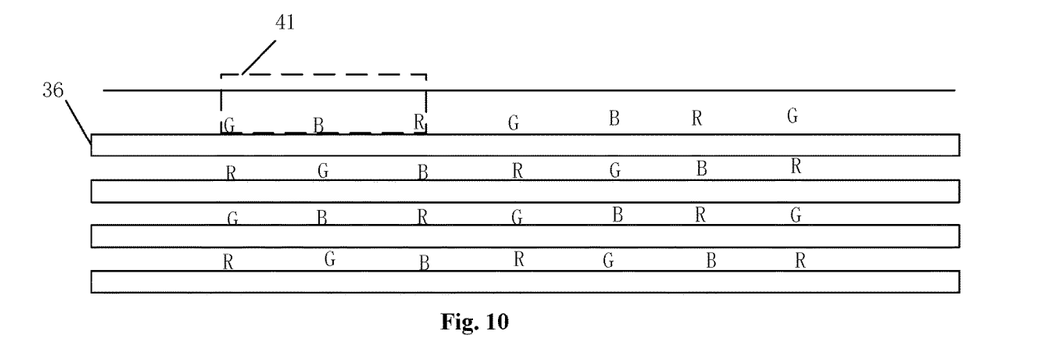
FIG. 10 is a schematic structural diagram of a supporting structure in some embodiments of the present disclosure.
Figure 11:
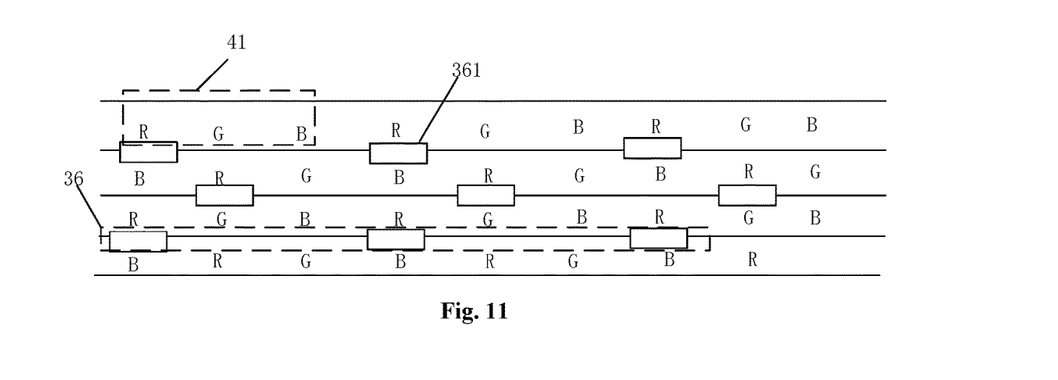
FIG. 11 is a schematic structural diagram of a supporting structure in some embodiments of the present disclosure.

As shown in FIG. 10 and FIG. 11, each pixel unit 41 includes an R sub-pixel, a G sub-pixel, and a B sub-pixel. FIG. 10 and FIG. 11 only show the pixel unit 41 and the pixel definition layer 36 of the display substrate in a top view. Further referring to FIG. 9, it can be seen that a structure of the pixel definition layer 36 at the position of the support structure 37 is of a shape (such as a strip shape) the same as the support structure 37, so that when the supporting structure is a strip-shaped structure, the structure of the pixel definition layer 36 at the position of the support structure 37 is also strip-shaped, as shown in FIG. 10. When the support structure 37 includes the plurality of support pillars sequentially disposed in equal distance from one another, the structure of the pixel definition layer 36 at the position of the support structure 37 also includes a plurality of support pillars 361 sequentially disposed in equal distance from one another, as shown in FIG. 11.

Based on the inventive concept of the above embodiments, a display device including the display substrate described above is further provided in some embodiments of the present disclosure. The display device may be any product or component having a display function, such as a mobile phone, a tablet computer, a television, a display, a notebook computer, a digital photo frame, a navigator.

In the description of the embodiments of the present disclosure, it should be appreciated that, terms indicating directions or positional relationships, such as "middle", "up", "down", "front", "back", "vertical", "horizontal", "top", "bottom", "inside", "outside", refer to directions or positional relationships as shown in the drawings, and are only for the convenience of describing the present disclosure and simplifying the description, rather than indicating or suggesting that the device or element must have specific directions, or must be constructed and operated in the specific directions. Therefore the terms should not be construed as a limitation on the present disclosure.

In the description of the embodiments of the present disclosure, it should be appreciated that a term "connection" should be understood in a broad sense unless otherwise specified and defined. For example, it may be an electrical connection, a direct connection, an indirect connection via an intermediate medium, or an internal connection of two elements. For a person of ordinary skill in the art, a specific meaning of the term in the present disclosure may be derived on a case-by-case basis.

Although the embodiments are disclosed in the present disclosure as above, the contents described above are only intended to facilitate understanding the present disclosure, and are not intended to limit the present disclosure. Although those skilled in the art may make various modifications and changes to forms and details of the embodiments without departing from the spirit and the scope of the present disclosure, the scope of the present disclosure is still defined by appended claims.

What is claimed is:

1. A method for manufacturing a display substrate, comprising:
    forming a control structure layer on a base substrate;
    forming a first planarization layer on the control structure layer;
    forming a support structure on the first planarization layer, wherein a material of the support structure comprises a negative photosensitive polymer;
    forming a protection layer enveloping the support structure on the first planarization layer formed with the support structure;
    forming a second planarization layer on the protection layer; and
    forming a first electrode on the second planarization layer, wherein the first electrode is electrically connected to the control structure layer.

2. The method according to claim 1, wherein the forming the control structure layer on the base substrate comprises:
    forming an active layer and a gate electrode on the base substrate;
    forming a third insulation layer on the base substrate formed with the active layer and the gate electrode, wherein a first via hole and a second via hole are formed in the third insulation layer; and
    forming a source electrode and a drain electrode on the third insulation layer, wherein the source electrode and the drain electrode are electrically connected to the active layer through the first via hole and the second via hole respectively.

3. The method according to claim 1, wherein the forming the second planarization layer on the protection layer comprises:
    forming an intermediate metal layer on the protection layer, wherein the intermediate metal layer is electrically connected to the control structure layer by penetrating the protection layer and the first planarization layer; and
    forming the second planarization layer on the base substrate formed with the intermediate metal layer, wherein a fourth via hole revealing the intermediate metal layer is formed in the second planarization layer, and the first electrode is electrically connected to the intermediate metal layer through the fourth via hole.

4. The method according to claim 1, wherein a material of the first planarization layer comprises a positive polyimide.

5. The method according to claim 1, further comprising:
    forming a pixel definition layer on the first electrode, wherein the pixel definition layer is provided with a sub-pixel opening revealing the first electrode; and
    forming a light-emitting layer in the sub-pixel opening.

6. The method according to claim 1, wherein the protection layer is made of silicon nitride, silicon oxide, or a composite of silicon nitride/silicon oxide.

7. A display substrate, comprising:
    a base substrate,
    a control structure layer disposed on the base substrate;
    a first planarization layer disposed on the control structure layer;
    a support structure disposed on the first planarization layer, wherein a material of the support structure comprises a negative photosensitive polymer;
    a protection layer disposed on the first planarization layer formed with the support structure, wherein the protection layer covers the support structure;
    a second planarization layer disposed on the protection layer; and
    a first electrode disposed on the second planarization layer, wherein the first electrode is electrically connected to the control structure layer.

8. The display substrate according to claim 7, wherein a cross-section of the support structure in a direction perpendicular to the base substrate is of an inverted trapezoid shape, and a width of a top edge of the support structure that is away from the base substrate is larger than a width of a bottom edge of the support structure that is toward the base substrate.

9. The display substrate according to claim 8, wherein an angle between a side surface of the support structure and a bottom surface of the support structure that is toward the base substrate ranges from 90° to 130°.

10. The display substrate according to claim 7, wherein a size of the support structure in a direction perpendicular to the base substrate ranges from 1.0 μm to 1.5 μm.

11. The display substrate according to claim 7, wherein a thickness of the protection layer ranges from 3000 angstroms to 5000 angstroms.

12. The display substrate according to claim 7, wherein a material of the first planarization layer comprises a positive polyimide.

13. The display substrate according to claim 7, further comprising an intermediate metal layer disposed between the protection layer and the second planarization layer, wherein the intermediate metal layer is electrically connected to the control structure layer by penetrating the protection layer and the first planarization layer, and the first electrode is electrically connected to the intermediate metal layer by penetrating the second planarization layer.

14. The display substrate according to claim 7, further comprising a pixel definition layer disposed on the first electrode, wherein the pixel definition layer is provided with a sub-pixel opening revealing the first electrode, and a light-emitting layer is disposed in the sub-pixel opening.

15. The display substrate according to claim 7, further comprising a plurality of pixel units arranged in an array comprising rows and columns, wherein each of the plurality of pixel units comprises a plurality of sub-pixels, and the support structure is disposed between two adjacent pixel units.

16. The display substrate according to claim 15, wherein the support structure is a strip-shaped structure and is disposed between two adjacent columns or rows of pixel units.

17. The display substrate according to claim 15, wherein the support structure comprises a plurality of support pillars sequentially disposed in equal distance from one another, the support structure is disposed between two adjacent columns or rows of pixel units, and each of the plurality of support pillars is disposed between two adjacent pixel units.

18. A display device, comprising the display substrate according to claim 7.

* * * * *